(12) United States Patent
Ikeda

(10) Patent No.: US 6,466,492 B2
(45) Date of Patent: Oct. 15, 2002

(54) SYNCHRONOUS SEMICONDUCTOR MEMORY DEVICE AND METHOD FOR CONTROLLING MASK DATA INPUT CIRCUIT

(75) Inventor: Shinichiro Ikeda, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/941,765

(22) Filed: Aug. 30, 2001

(65) Prior Publication Data
US 2002/0024882 A1 Feb. 28, 2002

(30) Foreign Application Priority Data
Aug. 31, 2000 (JP) .................................. 2000-263568

(51) Int. Cl.[7] ................................................ G11C 7/10
(52) U.S. Cl. ..................... 365/195; 365/191; 365/233; 365/189.05; 365/230.08; 365/189.08; 365/230.03; 365/227
(58) Field of Search .................... 365/233, 230.08, 365/189.05, 195, 191, 189.08, 230.03, 227, 226

(56) References Cited

U.S. PATENT DOCUMENTS 6,212,126 B1 * 4/2001 Sakamoto .................... 365/233
6,230,280 B1 * 5/2001 Okasaka ...................... 713/400
6,275,086 B1 * 8/2001 Douchi et al. ............... 327/296
6,295,245 B1 * 9/2001 Tomita et al. ......... 365/230.08

FOREIGN PATENT DOCUMENTS

JP 07-177015 7/1995 ....... H03K/19/0175

* cited by examiner

Primary Examiner—Andrew Q. Tran
(74) Attorney, Agent, or Firm—Arent Fox Kintner Plotkin & Kahn, PLLC

(57) ABSTRACT

A method for controlling an input circuit of a synchronous semiconductor memory device that reduces current consumption without changing commands or increasing signal input terminals. The synchronous semiconductor memory device includes an input circuit for receiving write data and is operated based on a synchronizing signal. When the synchronous semiconductor memory device is active, the input circuit is selectively inactivated based on a mask control signal, which masks the write data. When the synchronous semiconductor memory device enters a write mode in which the synchronous semiconductor memory device stores data, the input circuit is activated and the mask control signal is invalidated.

10 Claims, 7 Drawing Sheets

SYNCHRONOUS SEMICONDUCTOR MEMORY DEVICE AND METHOD FOR CONTROLLING MASK DATA INPUT CIRCUIT

BACKGROUND OF THE INVENTION

The present invention relates to a synchronous semiconductor memory device and a method for controlling an input circuit of a synchronous semiconductor memory device. More particularly, the present invention pertains to the reduction of power consumption in a synchronous semiconductor memory device.

Due to the increase in the processing speed of processors, recent semiconductor memory devices, such as a synchronous DRAM (SDRAM), have data input terminals that correspond to 32 or 64 bit data. To transfer data to and from a processor, the SDRAM first receives an active command from the processor in correspondence with a synchronizing signal (CLK). When several cycles of the synchronizing signal elapses from when the SDRAM is activated, the processor provides the SDRAM with a command such as that for reading or writing data. In response to the command, the SDRAM transfers data to or from the processor.

The latency is set during a write mode during which data is written to the SDRAM. When the latency is "0" in the write mode, the time for receiving a write command is substantially the same as the time for receiving write data (Data-In; DIN). In other words, the SDRAM receives the write command and the write data in response to the same synchronizing signal (CLK).

As the speed of the device increases, if the SDRAM starts to accept the write data (activation of input circuit) after receiving the write command, the SDRAM may not be able to receive the write data at a predetermined time. Thus, the SDRAM must be capable of simultaneously receiving the write command and the write data.

When the SDRAM is capable of receiving a write command, the SDRAM is also capable of receiving a read command and other commands. A plurality of data input circuits must always be activated to enable the input of write data whenever receiving the write command even though the SDRAM receives other commands. Thus, when the SDRAM is in a state capable of receiving each command, current flows through the input circuits even if data is actually not written. This consumes current.

FIG. 1 shows a schematic view illustrating the shifting of states in the SDRAM.

The SDRAM has a plurality of memory banks (hereafter simply referred to as banks). The SDRAM shifts from a bank active state to other states, such as a precharge state, a bank active suspend state, a read state, or a write state. The bank forms a memory unit that may be accessed in parallel. For example, an SDRAM having two banks includes two row address input systems of a typical DRAM. This enables an A bank and a B bank of the SDRAM to independently receive active commands. FIG. 1 illustrates the shifting of states in a single bank. The arrows drawn by solid lines represent shifting performed by command inputs (manual inputs), and the arrows drawn by broken lines represent automatic shifting (automatic sequence).

The SDRAM shifts from the bank active state to a bank active suspend state, a precharge state, a write state, or a read state in a single cycle of the synchronizing signal (CLK).

Input circuits connected to terminals, which receive commands and address signals, are activated to shift the state of the SDRAM. Further, data input circuits, which are connected to data input terminals, are each activated to shift the SDRAM to the write state.

FIG. 2 is a schematic block diagram of a first example of a prior art SDRAM 10.

The SDRAM 10 includes a clock buffer 1, a flip-flop (SFF) 2, an input buffer 3, a read/write (I/O) control circuit 4, an input buffer 5, and an output buffer 6.

The clock buffer 1 receives and amplifies a clock signal CLK to generate an internal clock signal CLK1. The internal clock signal CLK1 is provided to the SFF 2. The input buffer 3 receives a mask control signal DQM. The input buffer 3 amplifies the mask control signal DQM and generates an internal mask control signal DQM1. The internal mask control signal DQM1 is provided to the SFF 2. The SFF2 latches the internal mask control signal DQM1 in synchronism with the internal clock signal CLK1 and provides the I/O control circuit 4 with the latched mask control signal DQM1 as a synchronous mask control signal DQMS.

Referring to FIG. 3, the input buffer 5 includes an AND circuit 5a that receives input data DQ and a bank active recognition signal BACT. The input buffer 5 amplifies the input data DQ when the recognition signal BACT is active and generates write data Din. The write data Din is provided to the I/O control circuit 4.

The I/O control circuit 4 provides the output buffer 6 with read data Dout, which is read from a bank (not shown). The output buffer 6 amplifies the read data Dout and generates output data DQ.

Accordingly, if the bank active recognition signal BACT is inactive and the SDRAM 19 is in an idle state, a refreshing state, or a power down state, the input buffer 5 is disabled. This decreases power consumption. However, if the recognition signal BACT is active, power consumption does not decrease.

FIG. 4 is a schematic circuit diagram of a power cut circuit 50, which decreases power consumption in an SDRAM.

The power cut circuit 50 is arranged in the SDRAM to receive a plurality of control signals generated by internal circuits (not shown). The control signals include an A bank RAS enable signal ARAE, a B bank RAS enable signal BRAE, a reading signal READB, an output enable mask signal OEMSK, and a power down signal PWDNB.

The reading signal READB goes low for a clock cycle, which has a predetermined burst length, from when a read command is provided during a read mode. The output enable mask signal OEMSK masks (prohibits use of) an internal enable signal in the read mode. The mask signal OEMSK shifts based on a data mask signal DQM.

The power down signal PWDNB shifts the SDRAM to the power down mode based on a clock enable signal CKE. A power down signal PWDNB2 for a first stage input circuit is low in the power down mode.

The power cut circuit 50 includes a first OR circuit 11, a second OR circuit 12, a NAND circuit 13, and an inverter circuit 14. The first OR circuit 11 receives the A bank RAS enable signal ARAE and the B bank RAS enable signal BRAE. The second OR circuit 12 receives the reading signal READB and the output enable mask signal OEMSK.

The NAND circuit 13 receives an output signal of the first OR circuit 11, an output signal of the second OR circuit, and a power down signal PWDNB. The inverter circuit 14 inverts the output signal of the NAND circuit 13 and generates the first stage input circuit power down signal PWDNB2.

The operation of the power cut circuit 50 will now be discussed with reference to FIG. 5.

When the power cut circuit 50 receives an A bank active command in cycle T1 of the clock signal CLK, the A bank RAS enable signal ARAE goes high. Then, when the power cut circuit 50 receives the A bank read command in cycle T2 of the power cut circuit 50, the reading signal READB goes low. The output enable mask signal OEMSK is normally low. Thus, the first stage input circuit power down signal PWDNB2 goes low, and the first stage input circuit undergoes a power cut during a read operation.

When the output enable mask signal OEMSK goes high, the power down signal PWDNB goes high and the first stage input circuit is activated. The mask signal OEMSK is generated after the data mask signal DQM goes high. Accordingly, operation of the first stage input circuit is enabled again in cycle T5 and activated before cycle T6 starts. When a write command is input during cycle T7, input write data, which is input synchronously with the write command, is acquired.

The A bank write command is input during cycle T7 to prevent bus fights of read/write data (confrontation between output signal Q3 and input signal D1) outside the SDRAM.

The time during which the SDRAM is in an idle state, a refreshing state, a power down state, or a bank active state takes up a large portion of the entire SDRAM operation time. On the other hand, the time during which the SDRAM receives a read command or a write command to read or write data takes up a small portion of the entire DRAM operation time. In other words, the time used to read or write data is short relative to the entire operation time of the SDRAM. Therefore, although the power cut circuit 50 reduces the current consumption of the data input circuits when the SDRAM is performing a read operation, the reduced current consumption is small compared with the current consumption of the entire SDRAM. Thus, the reduction of current consumption in the entire system is insufficient.

When the SDRAM is in an idle state, a refreshing state, or a power down state, the SDRAM has to shift through two or more states to enter the write state. Thus, it is impossible for the data input circuits to enter a power down state. In other words, if the data input circuits are activated when the SDRAM shifts to the bank active state, the SDRAM completes the write operation within one cycle in response to the write command.

When the (bank) activate state takes up a large portion of the operation time of the SDRAM, it is difficult for the SDRAM to complete a write operation in response to a write command within one cycle. Thus, if it is confirmed beforehand that the write operation is not performed during the period from when the SDRAM shifts from the bank active state to the precharge state, data input circuits may be inactivated, for example, by an external signal during the bank active state. This reduces power consumption during the bank active state.

However, changes in commands for shifting states in a conventional general-purpose semiconductor memory device, such as the SDRAM, makes it difficult to use the SDRAM for general purposes. Further, it becomes difficult to use the SDRAM for general purposes when adding a terminal for receiving a signal, which inactivates data input circuits and notifies that data is to be written.

SUMMARY OF THE INVENTION

It is an object of the present invention to provide a synchronous semiconductor memory device that reduces power consumption without changing command systems and adding signal input terminals. It is a further object of the present invention to provide a method for controlling input circuits of such device.

To achieve the above object, the present invention provides a method for controlling a synchronous semiconductor memory device that is operated based on a synchronizing signal. The synchronous semiconductor memory device has an input circuit for receiving write data. The method includes activating the synchronous semiconductor memory device, and selectively inactivating the input circuit based on a mask control signal for masking the write data when the synchronous semiconductor memory device is activated.

In a further perspective, the present invention is a synchronous semiconductor memory device that is operated based on a synchronizing signal. The memory device includes a memory core for storing write data. A first input circuit receives the synchronizing signal and generates an internal synchronizing signal. A second input circuit receives the write data and outputs the write data to the memory core. A third input circuit receives a mask control signal for masking the write data and outputting the mask control signal. A flip-flop circuit is connected to the first and third input circuits for generating a synchronous mask control signal based on the internal synchronizing signal. A control circuit is connected to one of the third input circuit and the flip-flop circuit for generating a control signal to selectively inactivate the second input circuit when the memory core is in an active state, based on an active recognition signal, which indicates the active state, and either one of the mask control signal and the synchronous mask control signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

BRIEF DESCRIPTION OF THE PREFERRED EMBODIMENTS

Figure 1:
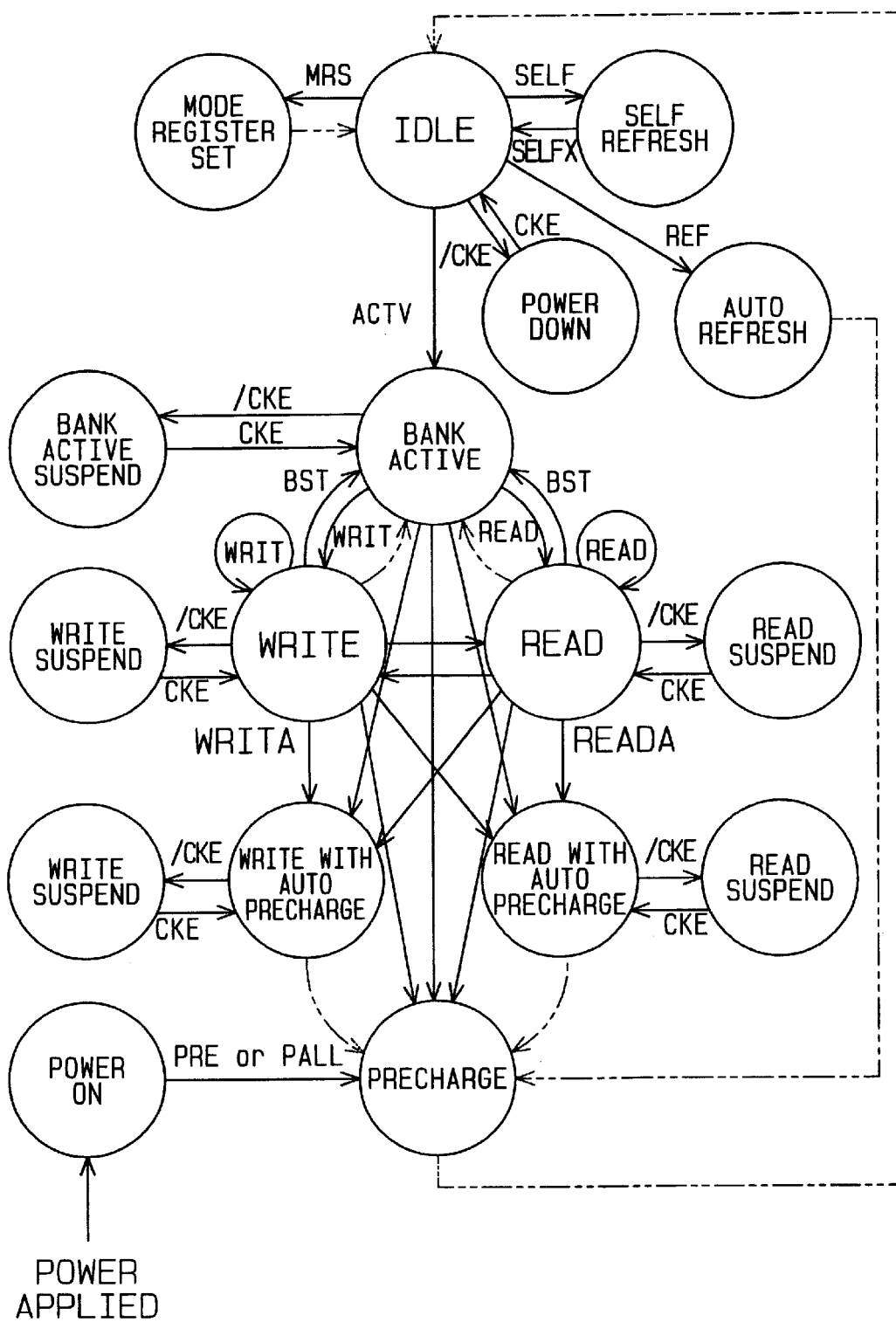
FIG. 1 is a diagram showing the shifting of states in a prior art SDRAM.
Figure 2:
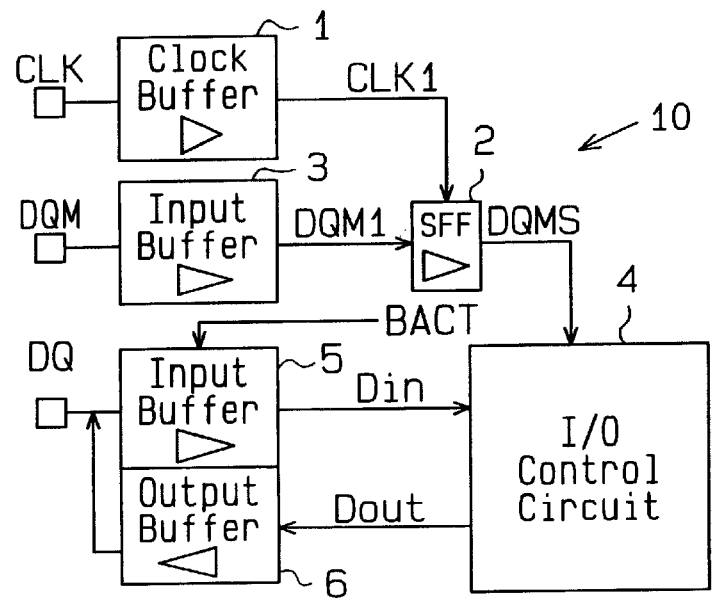
FIG. 2 is a schematic block diagram of a prior art input/output buffer.
Figure 3:
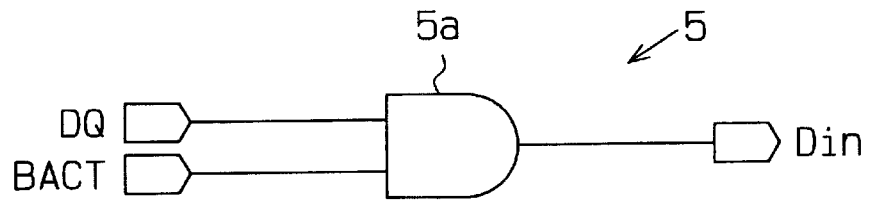
FIG. 3 is a schematic circuit diagram illustrating a first prior art example of an input buffer circuit.
Figure 4:
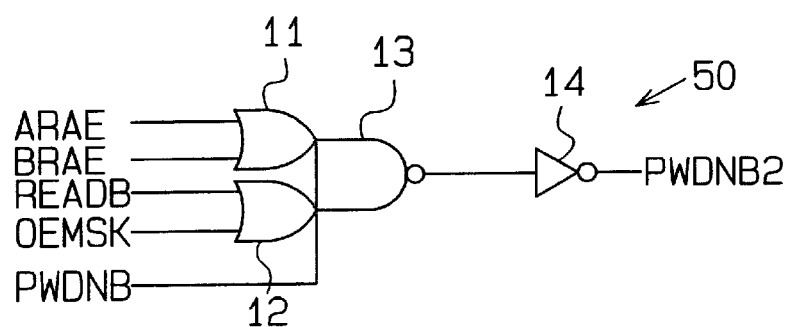
FIG. 4 is a schematic circuit diagram illustrating a second prior art example of an input buffer circuit.
Figure 5:
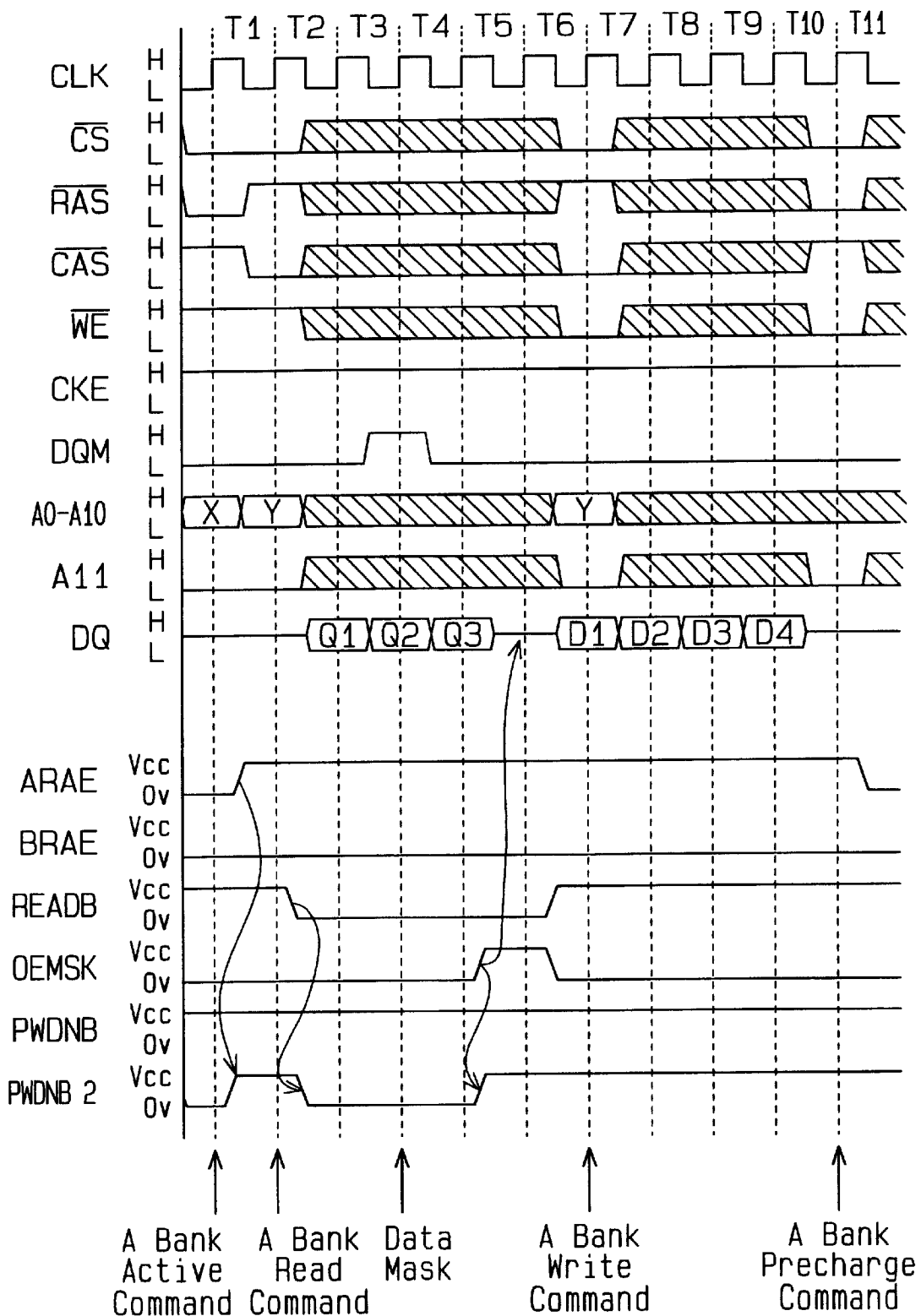
FIG. 5 is a timing chart illustrating the operation of the input buffer circuit of FIG. 4.

In the drawings, like numerals are used for like elements throughout.

Figure 6:
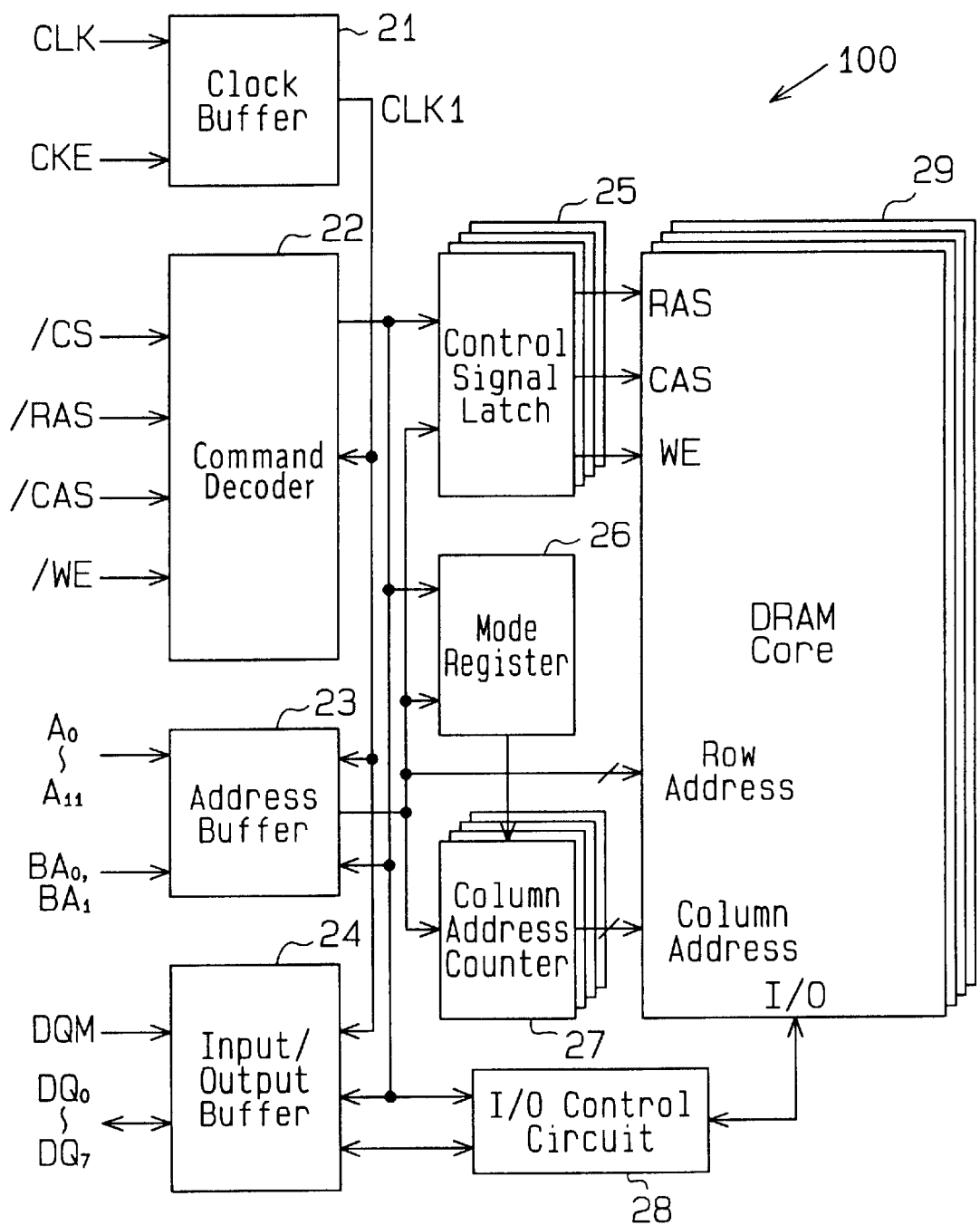
FIG. 6 is a schematic block diagram of an SDRAM according to a first embodiment of the present invention.

FIG. 6 is a schematic block diagram of an SDRAM 100 according to a preferred embodiment of the present invention. The SDRAM 100 includes a clock buffer 21, a command decoder 22, an address buffer 23, an input/output buffer 24, a plurality of control signal latches 25, a mode register 26, a plurality of column address counters 27, a write/read (I/O) control circuit 28, and a DRAM core 29.

The clock buffer (first input circuit) 21 receives a clock enable signal CKE and an external clock signal CLK from an external device and generates an internal clock signal CLK1 from the signals CKE, CLK. The internal clock signal CLK1 is provided to the internal circuit of the SDRAM 100.

The command decoder 22 receives a plurality of external commands COM from an external device. In the preferred embodiment, the external commands COM are a chip select signal /CS, a column address strobe signal /CAS, a write enable signal /WE, and a row address strobe signal /RAS.

The command decoder 22 decodes the signals /CAS, /WE, /CS, /RAS (signals that are low or high) of the external command COM based on the internal clock signal CLK1 to generate a plurality of commands. The commands include, for example, a write command, a read command, and a refresh command. The command decoder provides the commands as internal commands or enable signals to the address buffer 23, the input/output buffer 24, the control signal latch 25, the mode register 26, and the I/O control circuit 28.

The address buffer 23 receives address signals A0 to A11 and bank address signals BA0, BA1 from external devices based on the internal commands from the command decoder 22. The address buffer 23 generates address data based on the address signals A0–A11 and the bank address signals BA0, BA1. Then, the address buffer 23 provides the address data to the control signal latch 25, the mode register 26, and the column address counter 27. The address buffer 23 generates row address data based on the address signals A0–A11 and provides the row address data to the DRAM core 29.

The input/output buffer 24 is activated by an enable signal from the command decoder 22 and receives write data DQ0 to DQ7 and a mask control signal DQM from an external device. The input/output buffer 24 provides the I/O control circuit 28 with the write data DQ0 to DQ7 based on the internal clock signal CLK1. Further, the input/output buffer 24 masks the write data DQ0 to DQ7 based on the mask control signal DQM.

Each control signal latch 25 receives internal command from the command decoder 22 and address data from the address buffer 23. Further, each control signal latch 25 provides the DRAM core 29 with a control signal based on internal commands and address data. The control signals provided to the DRAM core 29 from the control signal latches 25 include signals for writing data, reading data, performing refreshing, and performing self-refreshing.

The mode register 26 receives an internal command from the command decoder 22 and an address data from the address buffer 23. The mode register 26 stores various processing modes of the DRAM core 29 based on the internal commands and the address data.

The column address counter 27 receives column address data from the address buffer 23 based on the address signals A0 to A11. The column address counter 27 provides column address data to the DRAM core 29 based on the mode of the mode register.

The I/O control circuit 28 controls data input and output of the DRAM core 29 based on the internal command from the command decoder 22. The I/O control circuit 28 provides the write data of the input/output buffer 24 to the DRAM core 29 and provides the read data of the DRAM core 29 to the input/output buffer 24.

The DRAM core 29 includes a plurality of banks (in the preferred embodiment, four). Each bank receives row address data from the address buffer 23 and control signals from the control signal latches 25. The address buffer 23 receives the bank address signals BA0, BA1 to select one of the banks. The control signal latches 25 and the column address counters 27 are provided in correspondence to each bank.

The DRAM core (bank) 29 performs various operations based on control signals. The operations include the writing of data to the incorporated memory cell arrays, the reading of data from the memory cell arrays, refreshing, and self-refreshing. The DRAM core 29 writes the write data DQ0–DQ7 received from the input/output buffer 24 at predetermined addresses of the memory cell based on the control signal and the address data.

Figure 7:
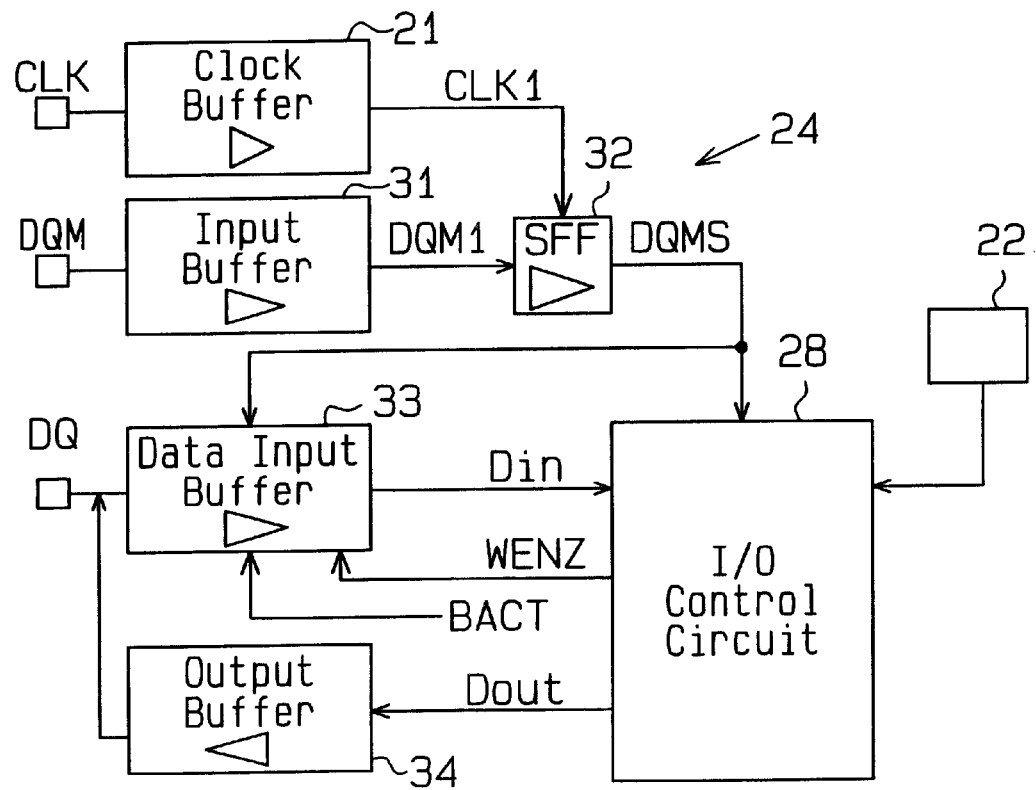
FIG. 7 is a schematic block diagram of an input/output buffer included in the SDRAM of FIG. 6.

FIG. 7 is a schematic block diagram of the input/output buffer 24. The input/output buffer 24 includes an input buffer 31, a flip-flop (SFF) 32, a data input buffer 33, and an output buffer 34.

The input buffer (third input circuit) 31 receives and amplifies the mask control signal DQM to generate an amplified internal mask control signal DQM1, which is provided to the SFF 32. The SFF 32 receives the internal clock signal CLK1 from the clock buffer 21. The internal clock signal CLK1 is generated from the clock signal CLK.

The SFF 32 generates a synchronous mask control signal DQMS, which is synchronous to the internal clock signal CLK1, based on the internal clock signal CLK1 and the internal mask control signal DQM1. Then, the SFF 32 provides the synchronous mask control signal DQMS to the data input buffer 33 and the I/O control circuit 28.

The I/O control circuit 28 confirms whether the SDRAM 100 is in the write mode based on the internal command from the command decoder 22 of FIG. 6. The I/O control circuit 28 generates a write mode recognition signal WENZ based on the confirmation and provides the signal WENZ to the data input buffer 33.

More specifically, when the internal command is the write command, the I/O control circuit 28 causes the write mode recognition signal WENZ to, for example, go high so that the SDRAM shifts to the write mode. If the command is one that shifts the SDRAM 100 from the write mode to other modes (e.g., precharge command), the I/O control circuit 28 causes the write mode recognition signal WENZ to go low.

The I/O control circuit 28 provides read data Dout to the data output buffer 34. The data output buffer 34 amplifies the read data Dout to generate output data DQ.

The data input buffer 33 receives a bank active recognition signal BACT from the command decoder 22 of FIG. 6. The bank active recognition signal BACT is generated from a logical OR operation of bank recognition signals respectively associated with the banks. That is, when at least one of the banks enters an active state, the bank active recognition signal BACT goes, for example, high.

The data input buffer 33 is enabled and disabled based on the bank recognition signal BACT, the synchronous mask control signal DQMS, and the write mode recognition signal WENZ. When the input buffer 33 is enabled, the input buffer 33 receives the input data DQ and outputs the input data DQ as the write data Din. When the input buffer 33 is disabled, the input buffer 33 does not output write data Din.

Figure 8:
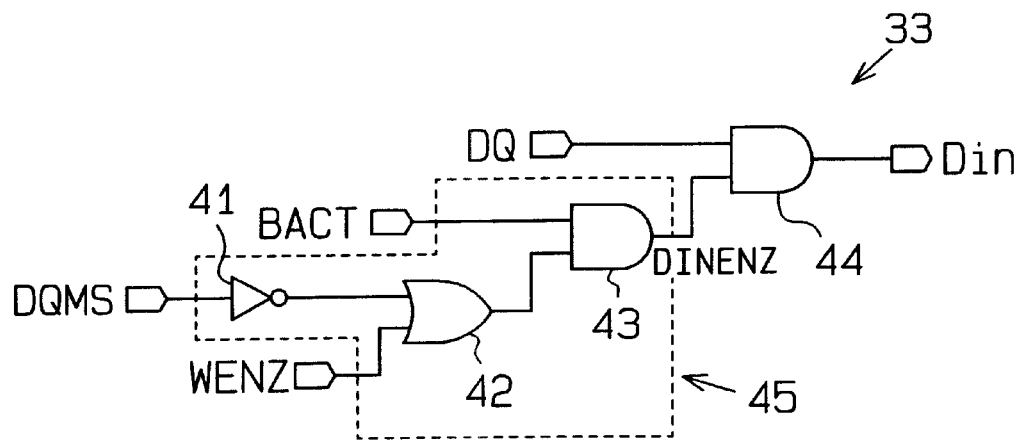
FIG. 8 is a circuit diagram of an input buffer included in the input/output buffer of FIG. 7.

FIG. 8 is a schematic circuit diagram of the data input buffer 33. The data input buffer 33 includes an inverter circuit 41, an OR circuit 42, a first AND circuit 43, and a second AND circuit 44.

The inverter circuit 41 receives and inverts the synchronous mask control signal DQMS from the SFF 32. The inverted synchronous mask control signal DQMS is provided to a first input terminal of the OR circuit 42. The write mode recognition signal WENZ is provided from the I/O control circuit to a second input terminal of the OR circuit 42. The OR circuit 42 performs a logical OR operation with the write mode recognition signal WENZ and the inverted synchronous mask control signal DQMS and provides the operation result to a first input terminal of the first AND circuit 43.

The bank active recognition signal BACT is provided to a second input terminal of the first AND circuit 43. The first AND circuit 43 performs a logical AND operation with the bank active recognition signal BACT and the output signal of the OR circuit 42 to generate a control signal DINENZ. The control signal DINENZ is provided to a first input terminal of the second AND circuit 44.

The second AND circuit 44 is activated and inactivated by the control signal DINENZ. When the second AND circuit 44 is activated, the second AND circuit 44 receives the input data DQ and outputs the received input data DQ as the write data Din.

Accordingly, if the synchronous mask control signal DQMS is provided to the data input buffer 33 when the SDRAM 100 is capable of receiving commands, the data input buffer 33 is inactivated and does not output the write data Din. The current consumption of the data input buffer 33 when inactivated is less in comparison to when the data input buffer 33 is activated. Further, the difference between the current consumptions when the data input buffer 33 is activated and inactivated is less in comparison to the prior art.

One data input buffer 33 is provided for each bit of the input data DQ. Thus, when the SDRAM 100 is active and the data input buffer 33 receives the synchronous mask control signal DQMS, the current consumption of the input/output buffer 24 decreases, which, in turn, decreases the current consumption of the SDRAM 100.

The data input buffer 33 has a control circuit (activation circuit) 45, which includes an inverter circuit 41, an OR circuit 42, and a first AND circuit 43. The control circuit 45 activates and inactivates a second AND circuit (second input circuit) 44, which functions as a first input stage circuit, with the write mode recognition signal WENZ, the bank active recognition signal BACT, and the synchronous mask control signal DQMS.

If the SDRAM receives a write command when the SDRAM 100 is active and capable of receiving commands, the data input buffer 33 is activated. The data input buffer 33 controls the transfer of the input data DQ based on the data input buffer 33. The SDRAM 100 has an input data masking function.

The operation of the SDRAM 100 will now be discussed with reference to FIG. 9.

Figure 9:
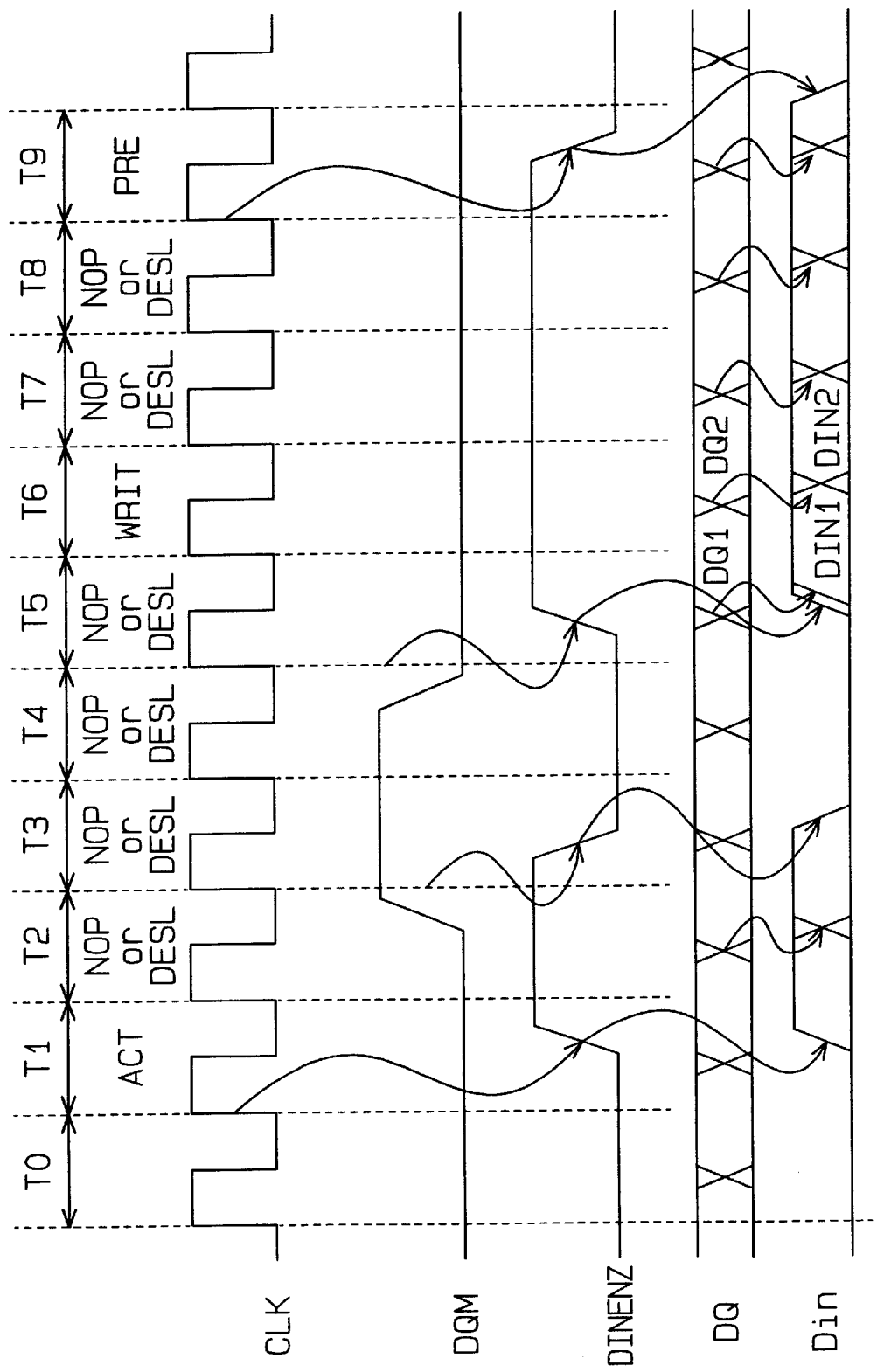
FIG. 9 is a combined timing and waveform chart illustrating the operation of the SDRAM of FIG. 6.

Referring to FIG. 9, in cycle T0 of the clock signal CLK, the SDRAM 100 is idle, as shown in the state of FIG. 1, and in a state prior to accepting a bank active command.

The SDRAM 100 then receives the bank active command when the clock signal CLK goes high in cycle T1 and enters a bank active state.

In cycle T1, the control circuit 45 of the input buffer 33 causes the control signal DINENZ to go high (shift to an enable level) based on the mask control signal DQM, which is low.

Then, in cycle T3, the SFF 32 of FIG. 7 latches the mask control signal DQM, which is high, in synchrony with when the clock signal CLK goes high. The control circuit 45 causes the control signal DINENZ to go low (shift to a disable level) based on the latched high mask control signal DQM (synchronous mask control signal DQMS). In other words, when the SDRAM 100 is active and not in the write mode, the control signal DINENZ, which is the output signal of the first AND circuit 43 is low (disable level). Thus, the second AND circuit 44 does not generate the write data Din.

In cycle T6, if the SDRAM 100 receives the write command when the clock signal CLK goes high, the SDRAM 100 shifts to the write mode (WRITE). In this state, the I/O control circuit 28 recognizes the write command and causes the write mode recognition signal WENZ to go high (shift to enable level). As a result, the control circuit 45 causes the control signal DINENZ to go high. The control signal DINENZ remains high regardless of the level of the mask control signal DQM until the SDRAM 100 completes the write mode. When the control signal DINENZ is high, the data input buffer 33 generates the write data Din.

When the SDRAM 100 is active and in the write mode, the first AND circuit 43 causes the control signal DINENZ to go high regardless of the level of the mask control signal DQM.

In cycle T9, if the SDRAM 100 receives a precharge command when the clock signal CLK goes high, the SDRAM 100 shifts to the precharge mode. In this state, the I/O control circuit 28 recognizes the precharge command and causes the bank active recognition signal BACT to go low. As a result, the control signal DINENZ goes low or high depending on the mask control signal DQM.

If the data input buffer 33 receives the synchronous mask control signal DQMS at a high level in the bank active state, the data input buffer 33 is inactivated when the clock signal CLK goes high. Thus, the write data Din is not output from the data input buffer. For example, if the write command is input after cycle T4 in cycle T5, the inactivation of the input buffer would be delayed. Thus, the input buffer would not be able to write data when the clock signal CLK goes high the next time. However, the shifting to other modes, such as the read mode, is enabled.

When writing data, if the mask control signal DQM received by the SDRAM 100 goes low, the SDRAM 100 causes the synchronous mask control signal DQMS to go low when the clock signal CLK goes high the next time. Thus, the SDRAM 100 receives the write command in the cycle that begins when the clock signal CLK goes high after the next time. Accordingly, the cycle delay (latency) from when the input buffer 33 is activated to when the input buffer 33 enters the write operation is equivalent to two clock cycles.

The SDRAM 100 of the preferred embodiment has the advantages described below.

(1) When the SDRAM 100 is activated, the data input buffer 33 is activated and inactivated based on the synchronous mask control signal DQMS. Thus, the inactivation of the data input buffer 33 when the SDRAM 100 is active reduces the current consumption of the input buffer 33. This reduces the power consumption of the SDRAM 100.

(2) The data input buffer 33 invalidates the synchronous mask control signal DQMS in the write mode in response to the write mode recognition signal WENZ. Thus, when entering the write mode, the data input buffer 33 is inactivated regardless of the level of the synchronous mask control signal DQMS. As a result, the SDRAM 100 functions in the same manner as in the prior art. This allows the SDRAM to be used for general purposes.

It should be apparent to those skilled in the art that the present invention may be embodied in many other specific forms without departing from the spirit or scope of the invention. Particularly, it should be understood that the present invention may be embodied in the following forms.

Figure 10:
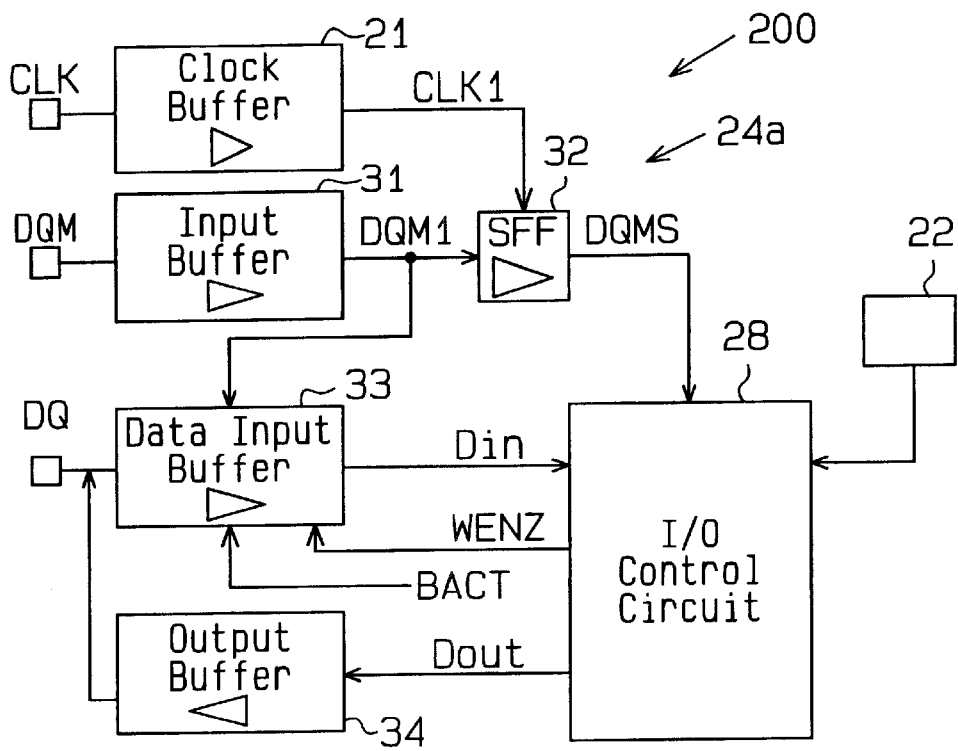
FIG. 10 is a schematic circuit diagram of a further input buffer circuit.

The data input buffer 33 may be controlled by the mask control signal DQM1, which is asynchronous to the clock signal CLK. For example, an input/output buffer 24a of the SDRAM 200 of FIG. 10 may include the data input buffer 33 that is controlled by the mask control signal DQM1.

Figure 11:
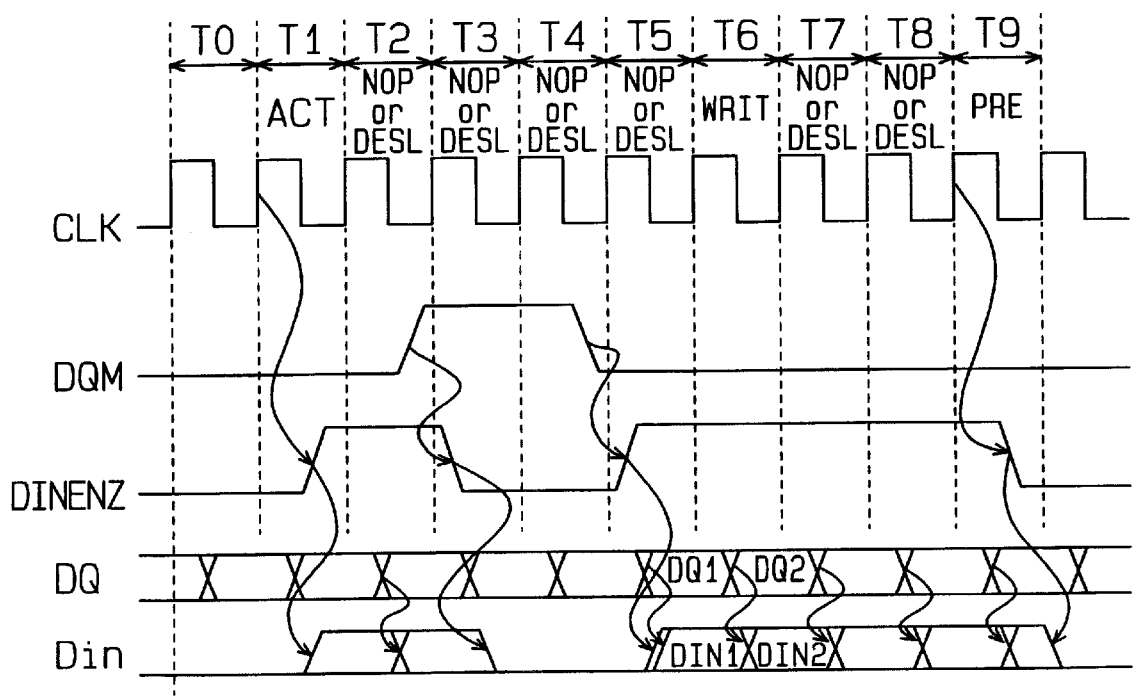
FIG. 11 is a combined timing and waveform chart illustrating the operation of a further SDRAM.

The data input buffer 33 receives the internal mask control signal DQM1, which is asynchronous to the clock signal CLK, from the input buffer 31. The data input buffer 33 is activated and inactivated based on the bank recognition signal BACT, the internal mask control signal DQM1, and the write mode recognition signal WENZ. As shown in FIG. 11, the data input buffer 33 is controlled regardless of the cycle of the clock signal CLK.

Therefore, the latency of the SDRAM 200 from when the data input buffer 33 is inactivated to when the data input buffer 33 performs the write operation is equivalent to the time from when the SDRAM 200 receives the mask control signal DQM, which is high, to when the input buffer 33 is activated added to one clock cycle. Accordingly, the latency is decreased in comparison to the SDRAM 100.

The present invention may be applied to an SDRAM having a data input terminal and a data output terminal that are formed separately.

The present invention may be applied to an SDRAM used for any number of input/output data bits (e.g., 16, 32, 64 bits). The structure of FIG. 6 may be changed (i.e., functions may be added or deleted) as required.

The present invention requires only that the input buffer 33 be controlled when the SDRAM is active and may thus be applied to, for example, a DRAM that does not have a bank structure.

In the I/O control circuit 28, the data read from the DRAM core 29 may be masked based on the mask control signal DQM.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed is:

1. A method for controlling a synchronous semiconductor memory device that is operated based on a synchronizing signal, wherein the synchronous semiconductor memory device has an input circuit for receiving write data, the method comprising the steps of:
    activating the synchronous semiconductor memory device; and
    selectively inactivating the input circuit based on a mask control signal for masking the write data when the synchronous semiconductor memory device is activated.

2. The method according to claim 1, further comprising the step of:
    activating the input circuit when the synchronous semiconductor memory device enters a write mode in which the synchronous semiconductor memory device stores the write data.

3. The method according to claim 2, further comprising the step of:
    invalidating the mask control signal when the synchronous semiconductor memory device enters the write mode.

4. The method according to claim 1, further comprising the step of:
    generating a synchronous mask control signal based on the synchronizing signal.

5. The method according to claim 4, further comprising the step of:
    activating the input circuit when the synchronous semiconductor memory device enters a write mode; and
    invalidating the synchronous mask control signal when the synchronous semiconductor memory device enters the write mode.

6. A synchronous semiconductor memory device that is operated based on a synchronizing signal, the memory device comprising:
    a memory core for storing write data;
    a first input circuit for receiving the synchronizing signal and generating an internal synchronizing signal;
    a second input circuit for receiving the write data and outputting the write data to the memory core;
    a third input circuit for receiving a mask control signal for masking the write data and outputting the mask control signal;
    a flip-flop circuit connected to the first and third input circuits for generating a synchronous mask control signal based on the internal synchronizing signal; and
    a control circuit connected to one of the third input circuit and the flip-flop circuit for generating a control signal to selectively inactivate the second input circuit when the memory core is in an active state, based on an active recognition signal, which indicates the active state, and either one of the mask control signal and the synchronous mask control signal.

7. The synchronous semiconductor memory device according to claim 6, wherein the control circuit invalidates either one of the mask control signal and the synchronous mask control signal when the memory core is in a write mode, based on a write mode recognition signal, which indicates the write mode.

8. The synchronous semiconductor memory device according to claim 7, wherein the control circuit includes:
    an OR circuit for receiving the write mode recognition signal and either one of the mask control signal and the synchronous mask control signal and generating an OR output signal; and
    an AND circuit for receiving the OR output signal and the active recognition signal and generating the control signal.

9. The synchronous semiconductor memory device according to claim 8, wherein the synchronous semiconductor memory device receives a plurality of command signals based on the synchronizing signal for setting an operation mode, the memory device further comprising:
    a write control circuit connected to the second input circuit for receiving the synchronous mask control signal and masking write data from the second input circuit based on the synchronous mask control signal, wherein the write control circuit provides the write data to the memory core and generates the write mode recognition signal based on the plurality of command signals.

10. The synchronous semiconductor memory device according to claim 9, wherein the memory core includes a plurality of memory banks connected to the write control circuit.

* * * * *